US011276560B2

(12) United States Patent
Sung et al.

(10) Patent No.: US 11,276,560 B2
(45) Date of Patent: Mar. 15, 2022

(54) SPACER ETCHING PROCESS

(71) Applicants: Mattson Technology, Inc., Fremont, CA (US); Beijing E-Town Semiconductor Technology Co., Ltd., Beijing (CN)

(72) Inventors: Tsai Wen Sung, Fremont, CA (US); Chun Yan, San Jose, CA (US); Michael X. Yang, Palo Alto, CA (US)

(73) Assignees: Mattson Technology, Inc., Fremont, CA (US); Beijing E-Town Semiconductor Technology Co., Ltd., Beijing (CN)

( * ) Notice: Subject to any disclaimer, the term of this patent is extended or adjusted under 35 U.S.C. 154(b) by 0 days.

(21) Appl. No.: 17/001,751

(22) Filed: Aug. 25, 2020

(65) Prior Publication Data

US 2021/0066047 A1 Mar. 4, 2021

Related U.S. Application Data

(60) Provisional application No. 62/894,092, filed on Aug. 30, 2019.

(51) Int. Cl.
*H01J 37/32* (2006.01)
*H01L 21/311* (2006.01)

(52) U.S. Cl.
CPC .. *H01J 37/32449* (2013.01); *H01J 37/32357* (2013.01); *H01L 21/31116* (2013.01); *H01J 2237/334* (2013.01)

(58) Field of Classification Search
CPC ........... H01J 2237/334; H01J 37/32357; H01J 37/32449; H01L 21/0337; H01L 21/31116;

(Continued)

(56) References Cited

U.S. PATENT DOCUMENTS

| 6,291,357 | B1 | 9/2001 | Zhang et al. |
| 9,881,794 | B1 | 1/2018 | Su |

(Continued)

FOREIGN PATENT DOCUMENTS

| CN | 105895510 A | 8/2016 |
| CN | 109997211 | 7/2019 |

(Continued)

OTHER PUBLICATIONS

Oehrlein et al. "Sidewall Surface Chemistry in Directional Etching Processes," Mat. Sci. and Eng., vol. 24, Issue 4, Dec. 1998, pp. 153-183.

(Continued)

*Primary Examiner* — Lan Vinh
(74) *Attorney, Agent, or Firm* — Dority & Manning, P.A.

(57) ABSTRACT

Systems and methods for processing a workpiece are provided. In one example, a method includes placing a workpiece on a workpiece support in a processing chamber. The workpiece has at least one material layer and at least one structure thereon. The method includes admitting a process gas into a plasma chamber, generating one or more species from the process gas, and filtering the one or more species to create a filtered mixture. The method further includes providing RF power to a bias electrode to generate a second mixture and exposing the workpiece to the second mixture to etch a least a portion of the material layer and to form a film on at least a portion of the material layer.

17 Claims, 7 Drawing Sheets

(58) Field of Classification Search
CPC ... H01L 21/32137; H01S 3/005; H01S 3/0085
USPC ....... 438/706, 710, 712, 714, 717, 719, 723, 438/758; 156/345.29, 345.3, 345.45
See application file for complete search history.

(56) References Cited

U.S. PATENT DOCUMENTS

| | | |
|---|---|---|
| 2007/0232071 A1 | 10/2007 | Balseanu et al. |
| 2014/0179109 A1* | 6/2014 | Lee .................... H01L 21/3065 438/714 |
| 2015/0262869 A1* | 9/2015 | Naik ................. H01L 21/02274 438/643 |
| 2016/0293420 A1 | 10/2016 | Tang et al. |
| 2017/0154826 A1 | 6/2017 | Posseme et al. |
| 2018/0240667 A1* | 8/2018 | Yu .................... H01L 21/02175 |
| 2018/0277387 A1 | 9/2018 | Royer et al. |
| 2019/0198301 A1 | 6/2019 | Ma et al. |

FOREIGN PATENT DOCUMENTS

| | | |
|---|---|---|
| KR | 20150065610 | 6/2015 |
| KR | 20190055681 | 5/2019 |
| WO | WO 2011/087874 | 7/2011 |

OTHER PUBLICATIONS

International Search Report and Written Opinion for Application No. PCT/US2020/047725, dated Dec. 2, 2020, 10 pages.

* cited by examiner

SPACER ETCHING PROCESS

PRIORITY

The present application claims the benefit of priority of U.S. Provisional Application Ser. No. 62/894,092, titled "SPACER ETCHING PROCESS," filed Aug. 30, 2019, which is incorporated herein by reference for all purposes.

FIELD

The present disclosure relates generally to processing of a workpiece, such as a semiconductor workpiece.

BACKGROUND

The processing of semiconductor workpieces can involve the deposition and removal of different materials layers on a substrate. Device dimension and materials thickness continue to decrease in semiconductor processing with shrinking critical dimensions in semiconductor devices. In advanced device nodes, material removal with high selectivity to other material can become increasingly important to semiconductor device performance. Self-aligned multiple patterning techniques (e.g., self-aligned double patterning (SADP), self-aligned quadruple patterning (SAQP)) can achieve reduced feature sizes with conventional lithography tool resolution.

SUMMARY

Aspects and advantages of embodiments of the present disclosure will be set forth in part in the following description, or may be learned from the description, or may be learned through practice of the embodiments.

One example aspect of the present disclosure is directed to a method for processing a workpiece. The workpiece may include at least one spacer layer and at least one mandrel structure. The method may include a plasma apparatus containing a plasma chamber having an interior operable to receive a process gas and a processing chamber having a workpiece support operable to support a workpiece. The plasma processing apparatus may further include an induction coil disposed about the plasma chamber and a bias electrode disposed in the workpiece support. The method includes placing the workpiece on the workpiece support in the processing chamber. The method includes admitting a process gas in the plasma chamber, the process gas includes a fluorine containing gas and a polymer forming gas. The method includes providing RF power to the induction coil to generate a first plasma from the process gas to generate a first mixture. The first mixture contains one or more first species. The method includes filtering the one or more first species to create a filtered mixture. The method includes providing RF power to the bias electrode to generate a second plasma in the filtered mixture in the processing chamber to generate a second mixture, the second mixture comprising one or more second species. The method includes exposing the workpiece to the second mixture to etch at least a portion of the at least one spacer layer of the workpiece and to form a polymer layer on at least a portion of the at least one spacer layer.

Another example aspect of the present disclosure is directed to a plasma processing apparatus. The plasma processing apparatus includes a plasma chamber having an interior operable to receive a process gas; a processing chamber having a workpiece support operable to support a workpiece, wherein a bias electrode is disposed in the workpiece support; a separation grid separating the plasma chamber from the processing chamber; a gas delivery system operable to flow a fluorine containing gas; an inductive element operable to induce a plasma in the plasma chamber; a bias source configured to provide DC power and RF power to the bias electrode; and a controller configured to control the gas delivery system, the inductive element, and the bias source to implement a spacer open process. The spacer open process may include operations. The operations can include admitting a process gas in the plasma chamber, the process gas comprising a fluorine containing gas and a polymer forming gas; providing RF power to the induction coil to generate a first plasma from the process gas to generate a first mixture, the first mixture comprising one or more first species; filtering the one or more first species to create a filtered mixture; and providing RF power to the bias electrode to generate a second plasma in the filtered mixture in the processing chamber to generate a second mixture, the second mixture comprising one or more second species.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1A:
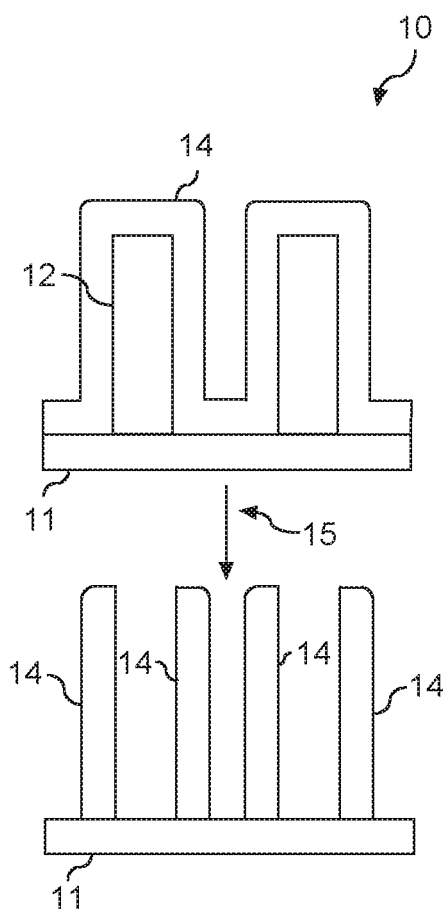
FIG. 1A depicts a spacer structure disposed on a workpiece subjected to a spacer etch process.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to processes for self-aligned multiple patterning (e.g., self-aligned double patterning (SADP), self-aligned quadruple patterning (SAQP)) on workpieces. Device dimension and thickness of materials continue to decrease with shrinking critical dimension in semiconductor devices. In fabrication of advanced logic and memory (e.g. dynamic random-access memory DRAM) devices, a so-called self-aligned multiple patterning technology can be an economic approach to significantly reduce feature size with conventional lithography tool resolution. In an example SADP process flow, a mandrel structure is formed on a substrate. A spacer layer (e.g., SiN layer) is formed over the mandrel structure using a deposition process (e.g., atomic layer deposition process). The spacer is opened at the top and bottom to form a spacer pair structure with mandrel (e.g. silicon) material in between. Subsequently, the mandrel material is selectively removed with the spacer structure remaining intact. The spacer structure further serves as a hardmask in a following anisotropic ion spacer etch process to transfer its pattern to underlying materials. In another example of process flow, a self-aligned double patterning (SADP) scheme can be repeated in a so called self-aligned quadruple patterning (SAQP) scheme.

Self-aligned multiple patterning processes can pose challenges. For instance, residual spacer material can cause micro-masking effects, leading to mandrel residues remaining during subsequent etch steps. Use of pure reactive ion etching or radical etching from, for instance, a remote plasma source can reduce spacer critical dimension, which can reduce accurate pattern transfer. Oxide loss (e.g., $SiO_2$) at the bottom of a structure can cause issues in subsequent pattern transfer steps due to uneven oxide that requires removal. Deposition-etch cyclic pulsing has been used in an attempt to preserve spacer critical dimension (CD). However due to top-to-bottom loading, this can result in reverse trapezoidal shapes which are undesirable. Further, the iso/dense microloading effect, which is common in etching patterns, can be difficult to control by etch processes alone.

According to example aspects of the present disclosure, a method for processing a workpiece (e.g., as part of a self-aligned multiple patterning process) can include, for instance, a spacer etch process. The spacer etch process can include generating one or more species in a plasma chamber of a plasma processing apparatus from a process gas. The one or more species may be generated from an inductively coupled plasma and/or a capacitively coupled plasma. The one or more species may be filtered (e.g., using a separation grid) to create a filtered mixture. RF energy may be applied to a bias electrode to generate a direct plasma containing one or more second species that are exposed to the workpiece. The process gas may include a fluorine containing gas, such as $CF_4$, $NF_3$, and/or $SF_6$, and a polymer forming gas, such as $CH_4$, $CH_3F$, or $H_2$. Diluent gases or carrier gases, such as Ar, He, $N_2$, or other gases such as $O_2$, may be added to the process gas. For example, in some embodiments the process gas may contain one or more diluent gases selected from Ar, He, or $N_2$.

During the spacer etch process, a polymer layer may be formed on the spacer structure from certain species present within the species mixture. In some embodiments, a polymer layer may form on the sidewalls of the spacer structure, thus acting as an etch-inhibitor and blocking the sidewalls of the spacer structure from etchant species. During the spacer etch process, DC bias may be added to the bias electrode in the workpiece support. The DC bias may accelerate the etch species toward the workpiece, thus facilitating a faster etch rate with respect to the perpendicular regions of the workpiece as compared to the lateral regions (e.g., sidewalls of the spacer material) of the workpiece. The DC bias may accelerate certain polymer forming species toward the workpiece, thus facilitation polymer deposition on the workpiece. The addition of the polymer film to the sidewall of the spacer structure may add to the etch anisotropy of the structure.

The spacer etch process can be continued or repeated until the spacer material is etched sufficiently (e.g., opened) and the mandrel structure is exposed. Once the mandrel structure is exposed, a mandrel removal process can be performed to remove the mandrel, leaving the spacers for transferring a pattern to the underlying material.

Example aspects of the present disclosure can provide a number of technical effects and benefits. For instance, the methods provided herein can incorporate reactive ion etching and process gas ratios to effectively etch the spacer material with high anisotropy and selectively due to lateral etch suppression and trench bottom deposition. Furthermore, the process gas ratio can be adjusted to control the CD loading for spacers having different pitch sizes. Additionally, the spacer etch process according to example aspects of the present disclosure can be used by etch equipment, such as plasma processing apparatuses, without pulsing capabilities and does not need to alternate between two different cyclic deposition and etch steps, thus reducing process time.

Aspects of the present disclosure are discussed with reference to a "workpiece." A workpiece can include a semiconductor wafer for purposes of illustration and discussion. Those of ordinary skill in the art, using the disclosures provided herein, will understand that the example aspects of the present disclosure can be used in association with any workpiece (e.g., semiconductor substrate or other suitable substrate). In addition, the use of the term "about" in conjunction with a numerical value is intended to refer to within twenty percent (20%) of the stated numerical value.

As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a workpiece support operable to support the workpiece.

Figure 1B:
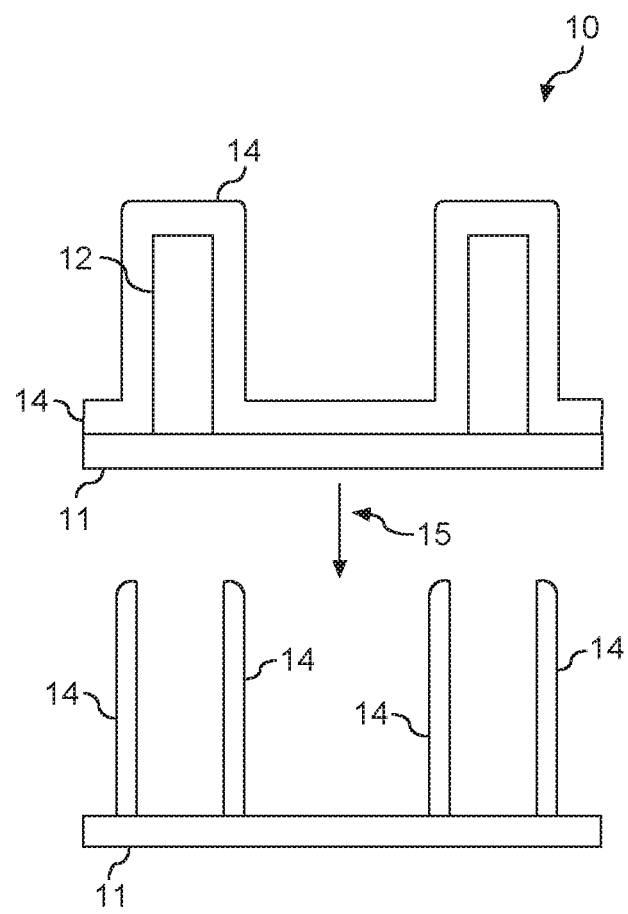
FIG. 1B depicts a spacer structure disposed on a workpiece subjected to a spacer etch process.

FIGS. 1A and 1B depict an example spacer opening etch process 15. More particularly, FIGS. 1A and 1B show a workpiece 10 having an example spacer profile thereon. The workpiece 10 includes a substrate 11, spacer material 14 and at least one mandrel 12. As shown in FIG. 1A, there is a certain amount of space between the spacer material 14 covering the mandrels 12. In FIG. 1A the space between the mandrels 12 is much smaller given that the mandrels 12 are placed closer together on the substrate 11 (E.g., smaller pitch). When exposed to a spacer opening etch process 15, given the smaller space between the mandrels 12 of FIG. 1A, the space may remain substantially unchanged after the etch process 15. Accordingly, while there may be some material loss of the spacer material 14 laterally within the space, the smaller space prohibits certain etchants from accessing the spacer material laterally.

However, this may not be the case for spacer structures having mandrels spaced father apart (e.g., larger pitch). For example, FIG. 1B depicts a spacer profile having mandrels 12 and spacer material 14 spaced farther apart, thus creating a larger space between the mandrels 12 as compared to that of FIG. 1A. Exposure of the workpiece 10 of FIG. 1B to a spacer opening process 15, results in loss of the spacer material 14 laterally, which may reduce the critical dimension CD of the spacer material 14, i.e. may decrease the width of the spacer material 14 remaining on the substrate 11. Reduction of the CD of the spacer material 14 can be undesirable as this can affect pattern transfer and subsequent etching processes.

Figure 2A:
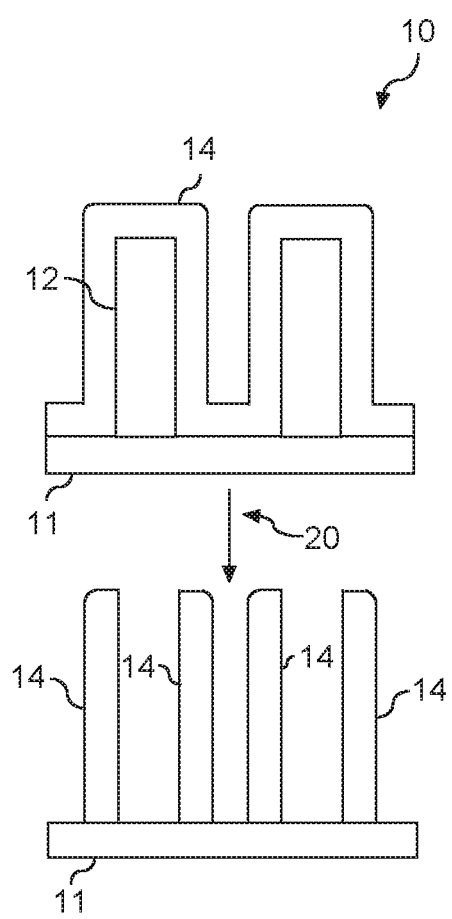
FIG. 2A depicts a spacer structure disposed on a workpiece subjected to an example spacer etch process of the present disclosure.
Figure 2B:
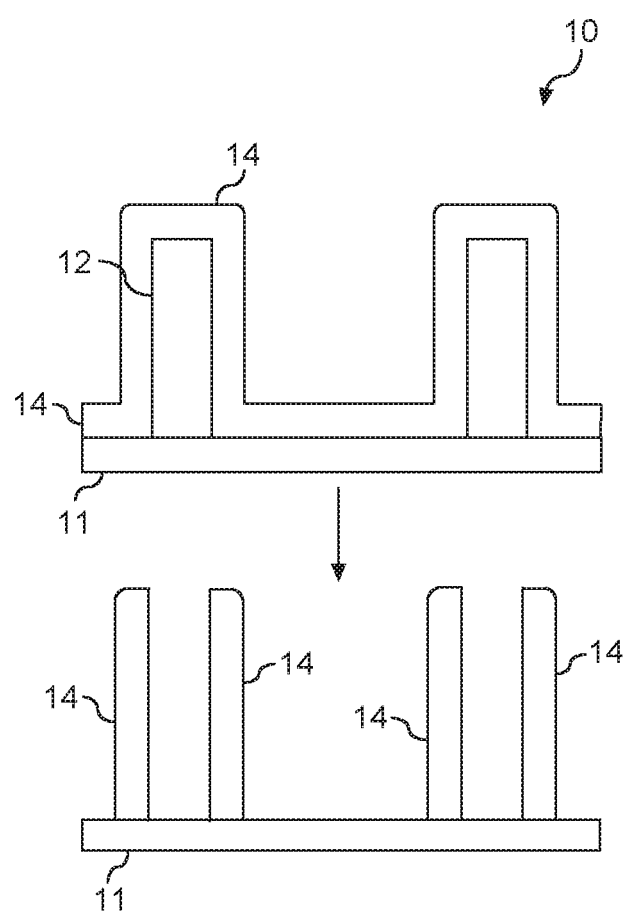
FIG. 2B depicts a spacer structure disposed on a workpiece subjected to an example spacer etch process of the present disclosure.

The method(s) according to example aspects of the present disclosure can lead to preservation of spacer sidewall material, thus reducing or preventing any change in the CD of the spacer material. For instance, FIGS. 2A and 2B depict a spacer etch process 20 according to example aspects of the present disclosure. As shown, the workpiece 10 includes a substrate 11, spacer material 14, and at least one mandrel 12. The space between the mandrels 12 in FIG. 2A is much smaller than the space between the mandrels as shown in FIG. 2B. Exposure of the workpiece 10 of FIG. 2B to the spacer etch process 20 according to example aspects of the present disclosure prevents the loss of spacer material 14 laterally. Accordingly, the CD of the spacer material can be maintained. Thus, spacer material 14 loss can be prevented using the method(s) described herein, irrespective of pattern density on the workpiece.

Figure 3:
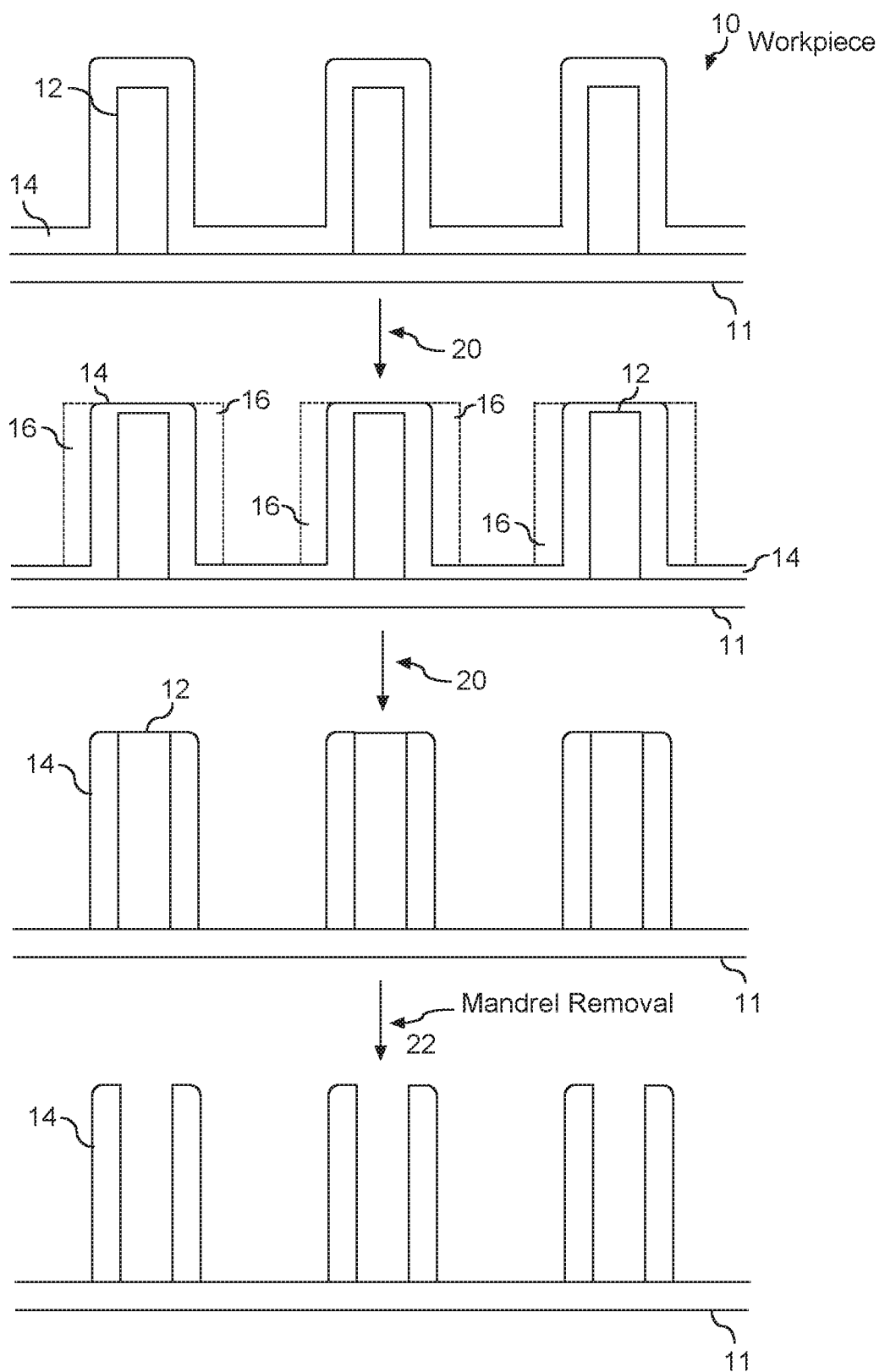
FIG. 3 depicts a spacer structure disposed on a workpiece subjected to an example spacer etch process of the present disclosure.

FIG. 3 depicts an overview of an example spacer etch method 20 according to example embodiments of the present disclosure. For instance, a workpiece can include at least one structure, that may include a patterned structure having one or more mandrel structures 12. (e.g., silicon mandrels) disposed on a substrate layer 11. The one or more mandrel structures may have one or more sidewalls. The substrate layer 11 can be a semiconductor layer (e.g., Si, SiGe) and/or a dielectric layer (e.g., $SiO_2$). A spacer layer 14 can be disposed over the mandrel structures 12 including the sidewalls of the mandrel structures 12. The spacer layer can be, for instance, a SiN spacer layer.

The workpiece 10 can be exposed to a spacer etch process 20 to at least partially remove a portion of the spacer 14. The workpiece 10 can be exposed to the spacer etch process 20 as desired until a sufficient amount of spacer material 14 has been removed to expose the mandrel structure 12. A mandrel removal process 22 can be implemented to remove the mandrel structure and leave the spacers 14 on the substrate layer 11. Furthermore, as shown in FIG. 3, during the etch process 20, polymer film 16 may be formed laterally on the sidewalls of the spacer material 14. Indeed, this polymer film 16 may passivate the lateral sidewall of the spacer material 14 during the etch process, thus preventing etchant species from laterally removing the sidewall of the spacer material 14.

Figure 4:
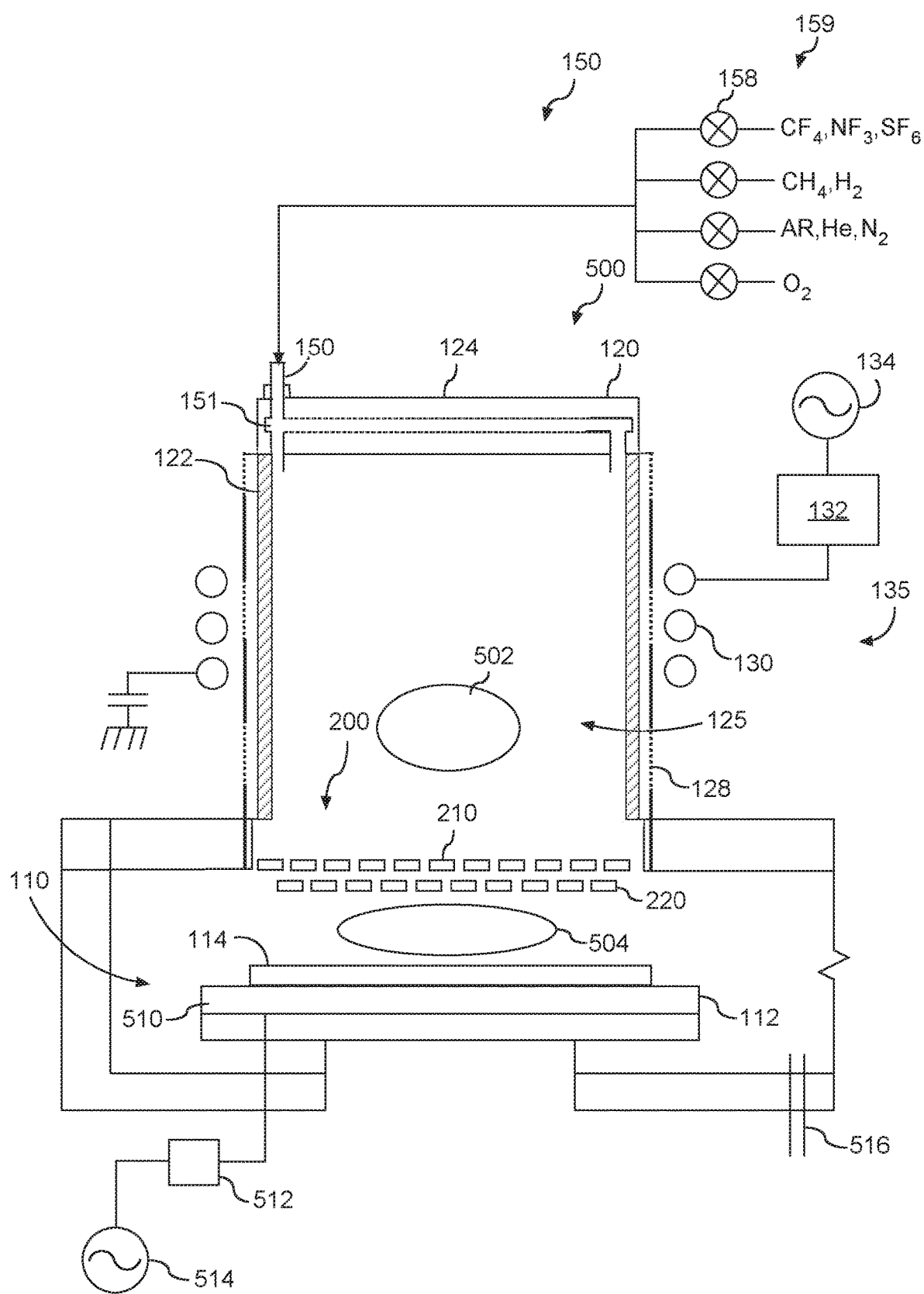
FIG. 4 depicts an example plasma processing apparatus according to example embodiments of the present disclosure.

FIG. 4 depicts an example plasma processing apparatus 500 that can be used to implement processes according to example embodiments of the present disclosure. More particularly, plasma processing apparatus 500 includes a processing chamber 110 and a plasma chamber 120 that is separated from the processing chamber 110. Processing chamber 110 includes a workpiece support or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases can be provided to the chamber interior from gas supply 150 and annular gas distribution channel 151 or other suitable gas introduction mechanism. When the induction coil 130 is energized with RF power from the RF power generator 134, a plasma 502 can be generated in the plasma chamber 120. In a particular embodiment, the plasma processing apparatus 100 can include an optional grounded Faraday shield 128 to reduce capacitive coupling of the induction coil 130 to the plasma 502.

As shown in FIG. 4, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed the interior of the processing chamber 110.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 500 of FIG. 4 is operable to generate a first plasma 502 (e.g., a remote plasma) in the plasma chamber 120 and a second plasma 504 (e.g., a direct plasma) in the processing chamber 110. The first plasma 502 can be generated by an inductively coupled plasma source. The second plasma 504 can be generated by, for instance, a capacitively coupled plasma source (e.g., bias). As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a workpiece support operable to support the workpiece.

More particularly, the plasma processing apparatus 500 of FIG. 4 includes a bias source having bias electrode 510 in the pedestal 112. The bias electrode 510 can be coupled to an RF power generator 514 via a suitable matching network 512. When the bias electrode 510 is energized with RF energy, a second plasma 504 can be generated from the filtered mixture or process gas in the processing chamber 110 for direct exposure to the workpiece 114. The processing chamber 110 can include a gas exhaust port 516 for evacuating a gas from the processing chamber 110.

In some embodiments, the pedestal 112 is configured such that a DC bias can be applied to the workpiece 114. In some embodiments, DC power is applied to the bias electrode 510 located in the pedestal 112. The DC bias can be applied to generate an electric field such that certain species can be attracted and/or accelerated towards the workpiece 114. With application of a DC bias to the workpiece 114, the flux of certain ionic species can be controlled. This can facilitate polymer film growth or fluorine radical etching on the structure of the workpiece 114. In some embodiments, the DC bias applied or provided to the bias electrode is from about 50 W to about 150 W. The DC bias may be applied to the workpiece 114 to accelerate certain species from the second plasma 504 towards the workpiece 114.

As shown in FIG. 4, according to example aspects of the present disclosure, the apparatus 100 can include a gas delivery system 150 configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as process gas. The gas delivery system 150 can include feed gas line(s) for delivery of fluorine containing gas (e.g., $CF_4$, $NF_3$, and/or $SF_6$), feed gas line(s) for delivery of a polymer forming gas (e.g., $H_2$, or $CH_4$), feed gas line(s) for delivery of an oxygen containing gas (e.g., $O_2$) and/or feed gas line(s) for a diluent or carrier gas (e.g., Ar, He, $N_2$). A control valve and/or mass flow controller 158 can be used to control a flow rate of each feed gas line to flow a process gas into the plasma chamber 120.

Figure 5:
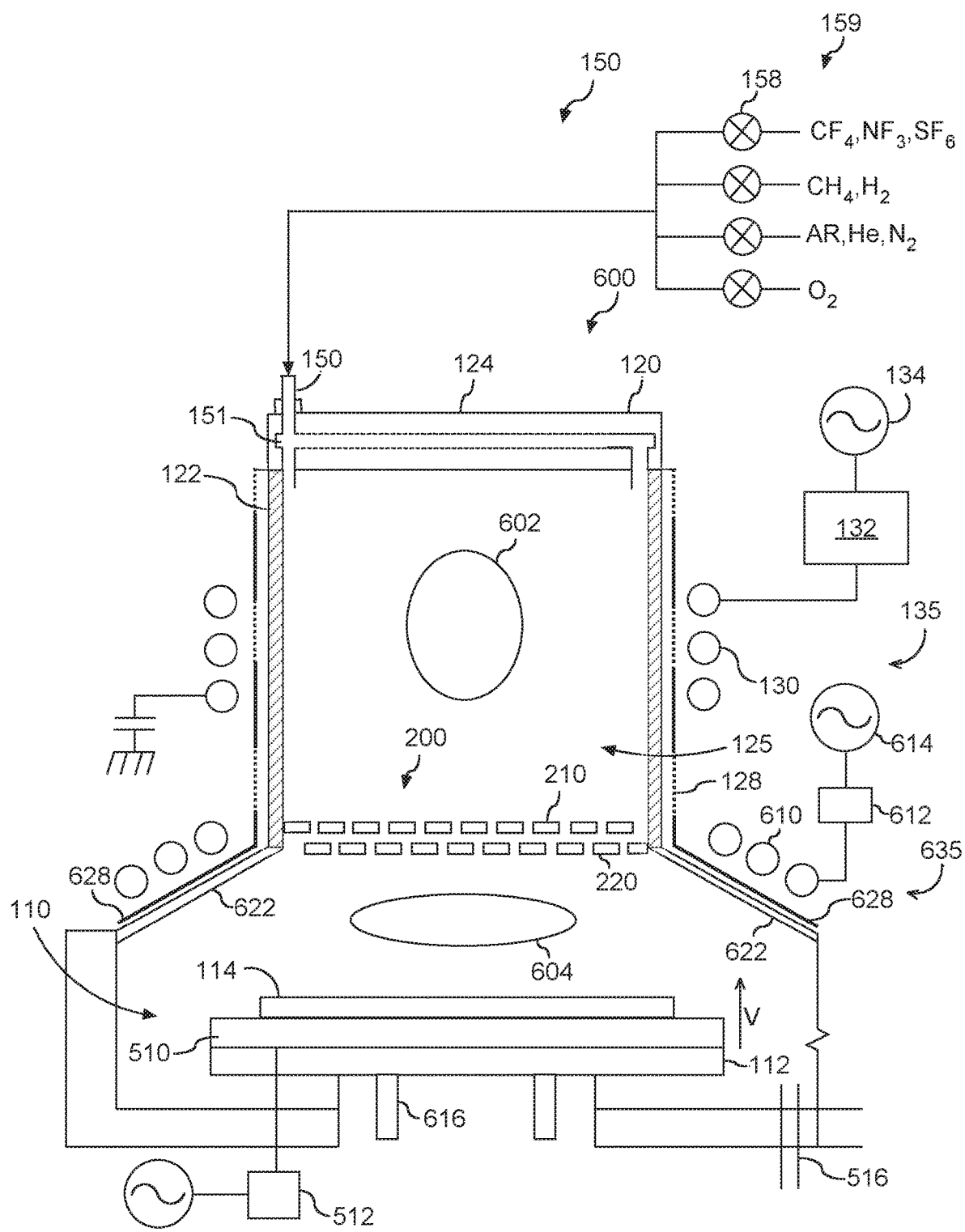
FIG. 5 depicts an example plasma processing apparatus according to example embodiments of the present disclosure.

FIG. 5 depicts a processing chamber 600 similar to that of FIG. 4. More particularly, plasma processing apparatus 600 includes a processing chamber 110 and a plasma chamber 120 that is separated from the processing chamber 110. Processing chamber 110 includes a workpiece support or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RE power generator 134 through a suitable matching network 132. Process gas (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 5, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 600 of FIG. 5 is operable to generate a first plasma 602 (e.g., a remote plasma) in the plasma chamber 120 and a second plasma 604 (e.g., a direct plasma) in the processing chamber 110. As shown, the plasma processing apparatus 600 can include an angled dielectric sidewall 622 that extends from the vertical sidewall 122 associated with the remote plasma chamber 120. The angled dielectric sidewall 622 can form a part of the processing chamber 110.

A second inductive plasma source 635 can be located proximate the dielectric sidewall 622. The second inductive plasma source 635 can include an induction coil 610 coupled to an RF generator 614 via a suitable matching network 612. The induction coil 610, when energized with RF energy, can induce a direct plasma 604 from a mixture in the processing chamber 110. A Faraday shield 628 can be disposed between the induction coil 610 and the sidewall 622.

The workpiece support 112 can be movable in a vertical direction noted as "V." For instance, the workpiece support 112 can include a vertical lift 616 that can be configured to adjust a distance between the workpiece support 112 and the separation grid assembly 200. As one example, the workpiece support 112 can be located in a first vertical position for processing using the remote plasma 602. The workpiece support 112 can be in a second vertical position for processing using the direct plasma 604. The first vertical position can be closer to the separation grid assembly 200 relative to the second vertical position.

The plasma processing apparatus 600 of FIG. 5 includes a bias source having bias electrode 510 in the workpiece support 112. The bias electrode 510 can be coupled to an RF power generator 514 via a suitable matching network 512. The processing chamber 110 can include a gas exhaust port 716 for evacuating a gas from the processing chamber 110.

In some embodiments, the pedestal 112 is configured such that a DC bias can be applied to the workpiece 114. In some embodiments, DC power is applied to the bias electrode 510 located in the workpiece support 112. The DC bias can be applied to generate an electric field such that certain species can be attracted and/or accelerated towards the workpiece 114. With application of a DC bias to the workpiece 114, the flux of certain ionic species can be controlled. This can facilitate polymer film growth or fluorine radical etching on the structure of the workpiece 114. In some embodiments, the DC bias applied or provided to the bias electrode is from about 50 W to about 150 W. The DC bias may be applied to the workpiece 114 to accelerate certain species from the second plasma 604 towards the workpiece 114.

As shown in FIG. 5, according to example aspects of the present disclosure, the apparatus 100 can include a gas delivery system 150 configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as process gas. As shown in FIG. 4, the gas delivery system 150 can include feed gas line(s) for delivery of fluorine containing gas (e.g., $CF_4$, $NF_3$, and/or $SF_6$), feed gas line(s) for delivery of a polymer forming gas (e.g., $H_2$, or $CH_4$), feed gas line(s) for delivery of an oxygen containing gas (e.g., $O_2$) and/or feed gas line(s) for a diluent or carrier gas (e.g., Ar, He, $N_2$). A control valve and/or mass flow controller 158 can be used to control a flow rate of each feed gas line to flow an ozone gas or a process gas into the plasma chamber 120.

In some embodiments, the apparatus 100 may include a controller. (Not Shown). The controller may be configured to control the gas delivery system, the inductive element, and the DC bias to implement a spacer etch process. The controller can include one or more processors and one or more memory devices. The memory devices can store computer-readable instructions that when executed by the one or more processors cause the controller to control aspects of the apparatus 500 or 600 to implement any of the methods disclosed herein. In some embodiments, the controller is configured to control the gas delivery system, the inductive element, and the DC bias to implement a spacer open process. The spacer open process may include certain operations. The operations may include admitting a process gas in the plasma chamber, the process gas comprising a fluorine containing gas and a polymer forming gas; providing RF power to the induction coil to generate a first plasma from the process gas to generate a first mixture, the first mixture comprising one or more first species; filtering the one or more first species to create a filtered mixture; and providing RF power to the bias electrode to generate a second plasma in the filtered mixture in the processing chamber to generate a second mixture, the second mixture comprising one or more second species. In certain embodiments, the operations further include providing DC bias to the bias electrode.

Figure 6:
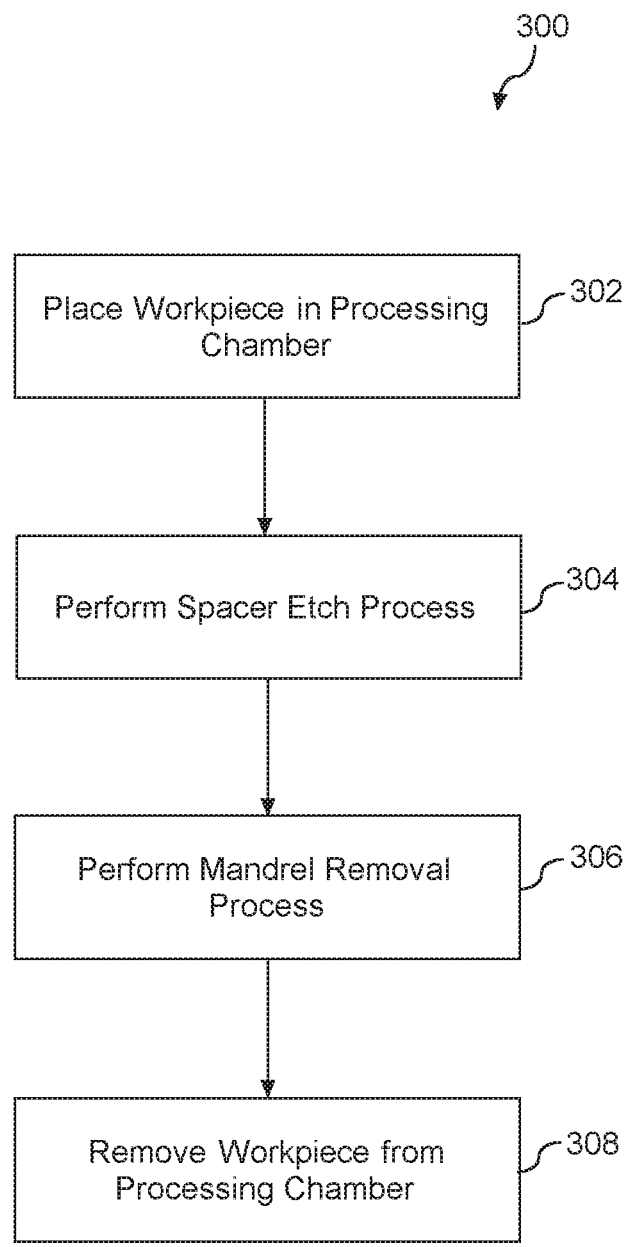
FIG. 6 depicts a flow diagram of an example: method according to example embodiments of the present disclosure.

FIG. 6 depicts a flow diagram of an example method (300) according to example embodiments of the present disclosure. The method (300) can be implemented, for instance, using the plasma processing apparatus 100 of FIG. 4. However, other plasma processing apparatus(s) can be used without deviating from the scope of the present disclosure. FIG. 6 depicts steps performed in a particular order for purposes of illustration and discussion. Those of ordinary skill in the art, using the disclosures provided herein, will understand that various steps of any of the methods described herein can be adapted, omitted, rearranged, repeated, performed simultaneously, expanded, include steps not illustrated, or otherwise rearranged without deviating from the scope of the present disclosure.

At (302), the method includes placing a workpiece on a workpiece support in a processing chamber of a plasma processing apparatus. The processing chamber can be separated from a plasma chamber (e.g., separated by a separation grid assembly). For instance, the method can include placing a workpiece 114 onto workpiece support 112 in the processing chamber 110 of FIG. 4. The workpiece can include at least one spacer material layer (e.g., SiN spacer) and at least one structure thereon. The structure may be one or more mandrel structures (Si mandrel). (See for example, FIG. 3).

At (304), the method can include performing a spacer etch process or spacer opening process. The spacer etch process can expose a spacer (e.g., SiN spacer) to species generated using an inductively coupled plasma generated in the plasma chamber or a direct plasma generated in the processing chamber, or both. The inductively coupled plasma or direct plasma can be generated from a process gas that includes a fluorine containing gas. The inductively coupled plasma can be generated from a process gas that includes a polymer forming gas (e.g., $CH_4$ or $H_2$). Optionally, an $O_2$ gas can be included in the process gas. Optionally, an inert gas can be used as diluent for the process gas.

For example, a process gas can be provided to the plasma chamber interior 125 via gas supply 150 (FIG. 4). An inductively coupled plasma can be induced in the process gas using plasma source 135. Species generated in the inductively coupled plasma can pass through a separation grid assembly 200 to filter ions in the species. Neutral radicals passing through the separation grid assembly are thus filtered to create a filtered mixture.

In some embodiments, the separation grid assembly 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid 200 can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

In some embodiments, a second plasma or direct plasma can be induced from the filtered mixture using the bias electrode 510 in the workpiece support 112. The direct plasma can be induced by providing RF power to the bias electrode. The second plasma may be generated from the filtered mixture that passes through separation grid as provided herein. In certain embodiments, exposure of the filtered mixture to the RF bias via the bias electrode 510 creates a second mixture that contains one or more second species. In some embodiments, the second plasma may be generated from a second process gas that is provided to the plasma chamber 125, filters through the separation grid 200, and enters the processing chamber 110. A second plasma or direct plasma may be generated from a second process gas in the processing chamber. Exposure of the second process gas to the RF bias via the bias electrode creates a second mixture that contains one or more second species.

In some embodiments, exposure of the workpiece to the filtered mixture and/or second mixture results in the removal of at least a portion of the spacer material layer that is perpendicular to the substrate. In some embodiments, the second mixture may contain one or more species containing fluorine radicals. When exposed to the workpiece, the fluorine radicals may etch spacer material from the workpiece. For example, the portion of the spacer material on top of or covering the top of the mandrel may be removed. Additionally, portions of the spacer material that cover the substrate material may be removed. In some embodiments, the portions of the spacer material on the sidewalls of the mandrel are not removed during the etching process. (See. FIG. 3).

Additionally, in some embodiments, exposure of the workpiece to the second mixture can result in the formation of a polymer layer or polymer film on at least a portion of the structure on the workpiece. The second mixture may contain one or more second species including fluorine radicals, hydrocarbon species, and/or hydrofluorocarbon species. In some embodiments, the one or more second species may contain species, wherein x is greater than or equal to 1 and less than or equal to 10, wherein y is greater than or equal to 1 and less than or equal to 10, wherein z is greater than or equal to 1 and less than or equal to 10. Exposure of the workpiece to the hydrofluorocarbon ($C_xH_yF_z$) species, may result in film formation on the lateral sidewall structure of the spacer material. In some embodiments a polymer layer is formed on the sidewall of the spacer material. Formation of the polymer layer on the spacer material sidewall, may passivate the sidewall and prevent the etching of the sidewall during the etching process. (See. FIG. 3).

Accordingly, exposure of the workpiece 114 having at least one structure thereon to the second mixture results in both polymer deposition on certain surfaces of the spacer material while etching other portions of the spacer material. Thus, the workpiece 114 can be exposed to one or more species in the second mixture to etch at least a portion of the spacer material layer on the workpiece and to form a polymer layer on at least a portion of the spacer material layer.

In some embodiments, the amount of polymer forming gas (e.g., $CH_4$) may be adjusted to control the amount or thickness of polymer film that is deposited on the at least one structure. For example, depending on the desired critical dimension of the spacer material, it may be desirable to adjust the amount of polymer forming gas added to the process gas in order to control the amount of polymer film or layer that is formed on the sidewall of the structure. For example, for etching workpieces having mandrel structures spaced closely together, the amount of polymer forming gas added to the process gas may be decreased so as not to overload the space between mandrels. In this manner, a thinner polymer layer forms on the spacer material, thus protecting the spacer material from lateral etching. The thinner polymer layer also ensure that the space between mandrel structures is not overloaded with polymer layer, thus reactive etchant species can still reach the bottom of the structure in order to effectively etch the bottom of the material layer. Furthermore, for etching workpieces having mandrel structures spaced farther apart, the amount of polymer forming gas added to the process gas may be increase so as to form a thicker polymer layer on the sidewall of the spacer material to prevent undesirable etching of the spacer sidewall material.

In some embodiments, during the exposure of the workpiece to the second mixture the workpiece is supplied with DC power via a DC bias to the bias electrode in the workpiece support 112. Application of the DC bias to the workpiece may accelerate certain species from the second mixture to the surface of the workpiece. For example, in some embodiments, application of the DC bias to the workpiece may result in accelerating certain etchant species, such as fluorine radical etchants, to the surface of the workpiece resulting in the removal of the spacer material layer that is perpendicular to the flow of the one or more species of the filtered mixture. In some embodiments, application of the DC bias to the workpiece may result in accelerating certain polymer forming species towards the surface of the workpiece resulting in the formation of polymer film on the workpiece.

In some embodiments, depending on the desired rate of etch and polymer formation, it may be advantageous to adjust the ratio of polymer forming gas to fluorine containing gas. For example, in some embodiments the ratio of polymer forming gas to fluorine containing gas may be from about 2 to 5. In certain embodiments, the polymer forming gas may comprise $CH_4$ and the fluorine containing gas may comprise $CF_4$ in a ratio of from about 2.5 to 4.5.

In some embodiments, the spacer etch process may be conducted at a process temperature. In certain embodiments, the spacer etch process has a process temperature of from about 15° C. to about 35° C. In certain embodiments, the process temperature may be adjusted to assist in the proper etch to passivation balance. For example, higher temperatures tend to discourage polymerization (i.e. formation of the polymer layer). Accordingly, in embodiments where a lower amount of polymer layer is desired and a higher amount of etch is required, the process temperature may be increased. In other embodiments, where a higher amount of polymer layer is desired and a slower etch rate is required, the process temperature may be decreased.

In some embodiments, the spacer etch process may be conducted at a process pressure. The process pressure may be from about 4 mT to about 10 mT. In certain embodiments, the process pressure may be adjusted to assist in the proper etch to passivation balance. For example, in embodiments where more rapid polymerization is desired, the process pressure may be increased. Further, higher process pressures may be used for intentional top-to-bottom CD loading to alter the etch profile.

At (306), the method can include performing a mandrel removal process. Any suitable process for etching the mandrel can be used without deviating from the scope of the present disclosure. In some embodiments, the mandrel removal process can expose the mandrel to radicals generated by a plasma in a remote plasma source to remove the silicon mandrel. For instance, in some embodiments, a fluorine containing gas (e.g., nitrogen trifluoride ($NF_3$) or tetrafluoromethane ($CF_4$) or other fluorine containing hydrocarbons such as $CH_2F_2$, $CHF_3$, $CH_3F$) can be used to create highly selective species associated with a remote ICP plasma source for removal of a silicon mandrel with reduced damage to spacers and sublayers.

More particularly, one example mandrel removal process can include generating species from a process gas using an inductive coupling element in a remote plasma chamber. The process can include introducing a fluorine containing gas (e.g., nitrogen trifluoride ($NF_3$) or tetrafluoromethane (CFO) or other fluorine containing hydrocarbons such as $CH_2F_2$, CHF$_3$, CH$_3$F) with the species to create a mixture. The method can include exposing the silicon structure of the workpiece to the mixture to remove at least a portion of the silicon mandrel. In some embodiments, the process gas can further include hydrogen (H$_2$). In some other embodiments, the process gas can also include an inert gas, such as helium (He), or argon (Ar).

In some embodiments, the process gas can include inert gas. The inert gas can be admitted into the plasma chamber. The fluorine containing gas (e.g., NF$_3$ or CF$_4$ or other fluorine containing hydrocarbons such as CH$_2$F$_2$, CHF$_3$, CH$_3$F) can be injected outside of the plasma chamber and at downstream flow location from the plasma chamber. For instance, the fluorine containing gas (e.g., NF$_3$ or CF$_4$ or other fluorine containing hydrocarbons such as CH$_2$F$_2$, CHF$_3$, CH$_3$F) can be injected via a post-plasma gas injection source. As an example, the post-plasma gas injection source can be located between a first grid plate and a second grid plate of a separation grid that can separate the plasma chamber from a processing chamber. In some embodiments, the post plasma gas injection source can be located beneath the separation grid in the processing chamber.

At (308) of FIG. 6, the method can include removing the workpiece from the processing chamber. Additional process steps can be performed (e.g., transferring the spacer to underlying substrate) prior to removing the workpiece from the processing chamber without deviating from the scope of the present disclosure.

Figure 7:
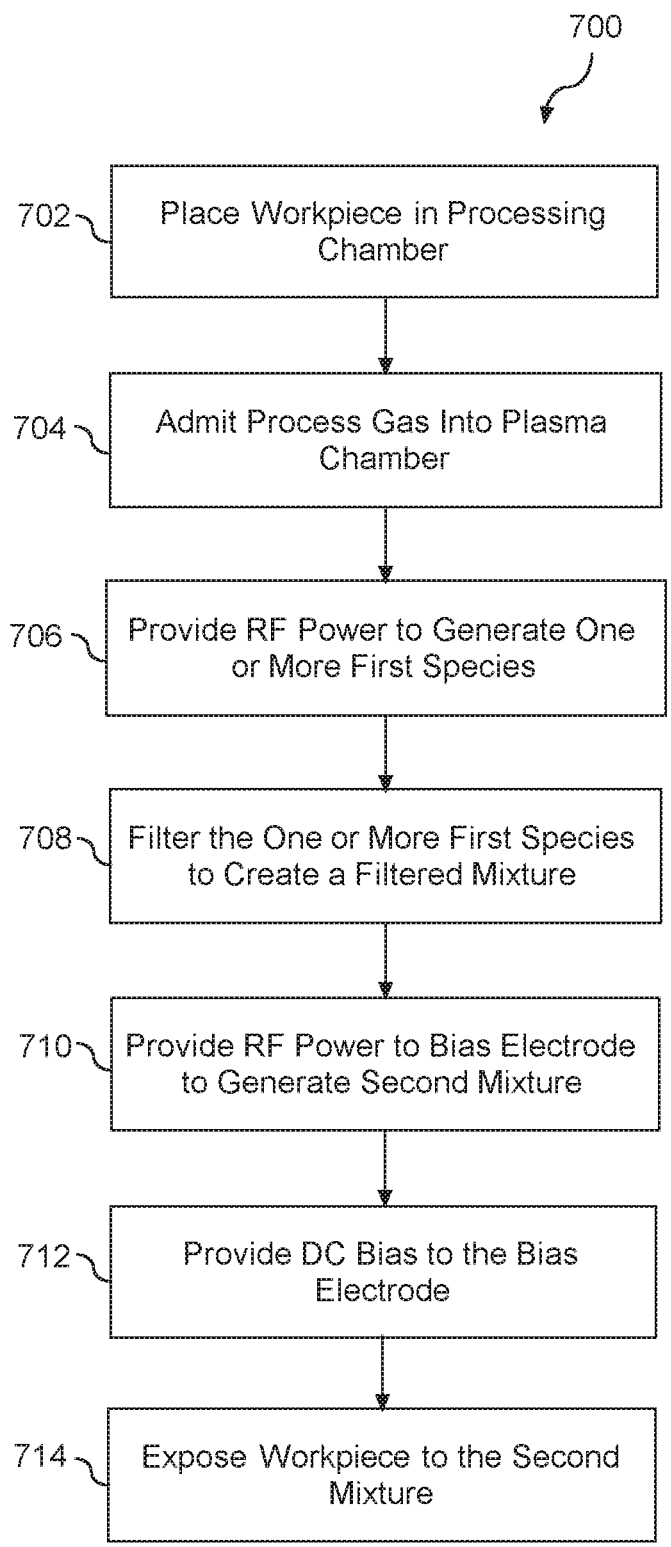
FIG. 7 depicts a flow diagram of an example method according to example embodiments of the present disclosure.

FIG. 7 illustrates an example spacer etch process (700) according to example aspects of the present disclosure.

At (702) the process includes placing the workpiece in the processing chamber. The method can include placing a workpiece 114 on a workpiece support 112 in the processing chamber 110 of a plasma processing apparatus. The processing chamber can be separated from a plasma chamber by a separation grid assembly). For instance, the method can include placing a workpiece 114 onto workpiece support/pedestal 112 in the processing chamber 110 of FIG. 4. The workpiece can include at least one spacer material layer (e.g., SiN spacer) and at least one structure thereon. The structure may be one or more mandrel structures (Si mandrel). (See for example, FIG. 3).

At (704) the process includes admitting a process gas into the plasma chamber. The process gas may be introduced into the interior of the plasma chamber 125 via a gas delivery system 150. The gas delivery system may be configured to deliver a process gas containing fluorine containing gas and/or a polymer forming gas to the interior of the plasma chamber 125. The gas delivery system may be configured to provide a process gas containing an oxygen containing gas or a carrier gas to the interior of the plasma chamber. In some embodiments, the fluorine containing gas includes tetrafluoromethane (CF$_4$), nitrogen trifluoride (NF$_3$), sulfur hexafluoride (SF$_E$), and mixtures or combinations thereof. In some embodiments, the polymer forming gas includes methane (CH$_4$), hydrogen (H$_2$), and mixtures or combinations thereof. In some embodiments, the carrier gas includes argon (Ar), helium (He), nitrogen (N$_2$), and mixtures or combinations thereof. In certain embodiments, the oxygen containing gas may include oxygen (O$_2$).

At (706) the process includes providing REF power to the induction coil 130 to generate one or more first species. In some embodiments, the inductively coupled plasma source 135 can be supplied with RF power via an RE power generator 134 to generate a plasma in the interior of the plasma chamber 125. The inductively coupled plasma source 135 may include an induction coil 130 disposed adjacent to the dielectric side wall 122 of the plasma chamber 125. When the induction coil 130 is energized with RE energy, a first plasma can be generated in the interior of the plasma chamber 125 from the process gas. The first plasma may contain a first mixture, wherein the first mixture contains one or more first species. The one or more first species may include fluorine radicals and/or hydrocarbon radicals.

At (708) the process includes filtering the one or more first species to create a filtered mixture. The one or more first species generated in the first plasma may be filtered via a separation grid 200 to filter ions in the species. Neutral radicals may pass through the separation grid 200 and into the interior of the processing chamber 110.

In some embodiments, the separation grid assembly 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid 200 can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

At (710) the process includes providing RF power to the bias electrode 510 to generate a second mixture. In some embodiments, RF power is supplied to the bias electrode 510 via an RF power generator 514 via a suitable matching network 512. When the bias electrode 510 is energized with RF energy, a second plasma 504 can be generated from the filtered mixture in the processing chamber 110 for direct exposure to the workpiece 114. For example, in some embodiments, the filtered mixture can be used to generate a second plasma containing one or more second species. The one or more second species may include fluorine radicals, hydrocarbon radicals, hydrofluorocarbon radicals, hydrogen radicals, or combinations thereof. In some embodiments, the one or more second species of the second mixture may include C$_x$H$_y$F$_z$, wherein x is greater than or equal to 1 and less than or equal to 10, wherein y is greater than or equal to 1 and less than or equal to 10, wherein z is greater than or equal to 1 and less than or equal to 10.

At (712) the method includes providing DC bias to the bias electrode 510. In certain embodiments, the workpiece support 112 is configured such that DC bias can be applied to the bias electrode 510. The DC bias can be applied to generate an electric field such that certain species from the second mixture can be attracted to and/or accelerated towards the workpiece 114. Accordingly, with application of the DC bias to the workpiece 114, the flux of certain ionic species can be controlled. This may help facilitate polymer film growth or fluorine radical etching on the structure of the workpiece 114. In some embodiments, the DC bias applied or provided to the bias electrode is from about 50 W to about 150 W. The DC bias may be applied to the workpiece 114 to accelerate certain species from the second plasma 504 towards the workpiece 114. In certain embodiments, providing DC bias to the bias electrode 510 is optional.

At (714) the process includes exposing the workpiece to the second mixture. In some embodiments, exposure of the workpiece 114 to the second mixture etches or removes at least a portion of the spacer layer from the workpiece and forms a polymer layer on at least a portion of the spacer layer on the workpiece.

In some embodiments, exposure of the workpiece to the second mixture results in the removal of at least a portion of the spacer material layer that is perpendicular to the workpiece. For example, when exposed to the workpiece, certain fluorine radicals present in the second mixture may etch spacer material from the workpiece. For example, the portion of the spacer material on top of or covering the top of the mandrel may be removed. Additionally, portions of the spacer material that cover the substrate material may be removed. In some embodiments, the portions of the spacer material on the sidewalls of the mandrel are not removed during the etching process. (See. FIG. 3).

Additionally, in some embodiments, exposure of the workpiece to the second mixture can result in the formation of a polymer layer or polymer film on at least a portion of the structure on the workpiece. In some embodiments, the second mixture may contain one or more second species including fluorine radicals, hydrocarbon species, and/or hydrofluorocarbon species. In some embodiments, the one or more second species may contain $C_xH_yF_z$ species, wherein x is greater than or equal to 1 and less than or equal to 10, wherein y is greater than or equal to 1 and less than or equal to 10, wherein z is greater than or equal to 1 and less than or equal to 10. Exposure of the workpiece to the hydrofluorocarbon ($C_xH_yF_z$) species, may result in film formation on the lateral sidewall structures of the spacer material. In some embodiments a polymer layer is formed on the sidewall of the spacer material. Formation of the polymer layer on the spacer material sidewall, may passivate the sidewall and prevent the etching of the sidewall during the etching process. (See. FIG. 3).

Accordingly, exposure of the workpiece 114 having at least one structure thereon to the second mixture results in both polymer deposition on certain surfaces of the spacer material while etching other portions of the spacer material. Thus, the workpiece 114 can be exposed to one or more species in the second mixture to etch at least a portion of the spacer material layer on the workpiece and to form a polymer layer on at least a portion of the spacer material layer.

Example process parameters for a spacer etch process are provided below:
  Process Gas: $CH_4$, $CH_4$
  Dilution Gas: Ar
  Process Pressure: about 300 to about 600 mT
  Inductively Coupled Plasma Source Power: about 600 to about 1000 W (e.g. about 900 W)
  Bias Source Power: about 50 to about 120 W (e.g. about 100 W)
  Workpiece Temperature: about 15° C. to about 35° C. (e.g. about 20° C.)
  Process Period: about 40 to about 80 seconds (e.g. about 60 seconds)
  Gas Flow Rates for Process Gas:
    Process Gas: 10-80 sccm $CF_4$ (e.g. about 15 sccm); 40-70 sccm $CH_4$ (e.g. about 65 sccm)
    Dilution Gas: 160-230 sccm Ar (e.g. about 225 sccm)

Example process parameters for a mandrel removal process using an inductively coupled plasma source according to example embodiments of the present disclosure are provided below:
  Process Gas: $CF_4$, $N_2$, $H_2$
  Dilution Gas: He/Ar
  Process Pressure: about 200 mTorr to about 1000 mTorr (e.g., about 300 mTorr)
  Inductively Coupled Plasma Source Power: about 600 W to about 2500 W (e.g., about 2500 W)
  Bias Source Power: about 0 W to about 150 W (e.g., about 0 W)
  Workpiece Temperature: (20° C.) about 5° C. to 90° C. (e.g., about 20° C.)
  Process Period: about 10 seconds to 200 seconds (e.g., 75 seconds)
  Gas Flow Rates for Process Gas: about 50 sccm to about 50 sccm (e.g., 350 sccm)

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece in a plasma processing apparatus, the plasma processing apparatus comprising a plasma chamber having an interior operable to receive a process gas and a processing chamber having a workpiece support operable to support a workpiece, wherein the workpiece comprises at least one spacer layer and at least one mandrel structure formed on a substrate layer of the workpiece, further wherein the plasma processing apparatus comprises an induction coil disposed about the plasma chamber and a bias electrode disposed in the workpiece support, the method comprising:
  placing the workpiece on the workpiece support in the processing chamber;
  admitting a process gas in the plasma chamber, the process gas comprising a fluorine containing gas and a polymer forming gas;
  providing RF power to the induction coil to generate a first plasma from the process gas to generate a first mixture, the first mixture comprising one or more first species;
  filtering the one or more first species to create a filtered mixture;
  providing RF power to the bias electrode to generate a second plasma in the filtered mixture in the processing chamber to generate a second mixture, the second mixture comprising one or more second species; and
  exposing the workpiece to the second mixture to etch one or more portions of the at least one spacer layer of the workpiece and to form a polymer layer on one or more lateral sidewalls of the at least one spacer layer,
  wherein etching the one or more portions of the at least one spacer layer comprises removing a top portion of the at least one spacer layer to expose the at least one mandrel structure and removing a bottom portion of the at least one spacer layer to expose the substrate layer, wherein the polymer layer passivates the one or more lateral sidewalls while the one or more portions of the at least one spacer layer are etched.

2. The method of claim 1, wherein the fluorine containing gas comprises $CF_4$, $NF_3$, $SF_6$.

3. The method of claim 1, wherein the polymer forming gas comprises $CH_4$, $CH_3F$, or $H_2$.

4. The method of claim 1, wherein the process gas further comprises a diluent gas, wherein the diluent gas comprises Ar, He, $N_2$, $O_2$, and mixtures thereof.

5. The method of claim 1, wherein the second mixture comprises $C_xH_yF_z$, wherein x is greater than or equal to 1 and less than or equal to 10, wherein y is greater than or equal to 1 and less than or equal to 10, wherein z is greater than or equal to 1 and less than or equal to 10.

6. The method of claim 1, wherein exposing the workpiece to the second mixture forms a polymer layer on the at least one spacer layer.

7. The method of claim 1, further comprising providing a DC bias to the bias electrode.

8. The method of claim 7, wherein providing DC bias to the bias electrode accelerates one or more species from the second mixture to the workpiece.

9. The method of claim 7, wherein the DC bias provided to the bias electrode is from about 50 W to about 150 W.

10. The method of claim 1, wherein filtering the one or more first species to create a filtered mixture comprises filtering the one or more first species via a separation grid separating the plasma chamber from the processing chamber.

11. The method of claim 1, wherein exposing the workpiece to the second mixture occurs at a process pressure, wherein the process pressure is from about 4 mT to about 10 mT.

12. The method of claim 1, wherein exposing the workpiece to the second mixture occurs at a process temperature, wherein the process temperature is from about 15° C. to about 35° C.

13. The method of claim 1, wherein the polymer forming gas comprises $CH_4$.

14. The method of claim 13, wherein the method comprises increasing an amount of $CH_4$ in the process gas to provide for an increase in an amount of polymer layer on the at least one spacer layer.

15. The method of claim 1, wherein the process gas comprises $CH_4$ and $CF_4$, wherein a ratio of $CH_4$ to $CF_4$, is from about 2.5 to 4.5.

16. A plasma processing apparatus, comprising:
a plasma chamber having an interior operable to receive a process gas;
a processing chamber having a workpiece support operable to support a workpiece, wherein a bias electrode is disposed in the workpiece support;
a separation grid separating the plasma chamber from the processing chamber;
a gas delivery system operable to flow a fluorine containing gas;
an inductive element operable to induce a plasma in the plasma chamber;
a bias source configured to provide DC power and RF power to the bias electrode; and
a controller configured to control the gas delivery system, the inductive element, and the bias source to implement a spacer open process, the spacer open process comprising operations, the operations comprising:
admitting a process gas in the plasma chamber, the process gas comprising a fluorine containing gas and a polymer forming gas;
providing RF power to the inductive element to generate a first plasma from the process gas to generate a first mixture, the first mixture comprising one or more first species;
filtering the one or more first species to create a filtered mixture;
providing RF power to the bias electrode to generate a second plasma in the filtered mixture in the processing chamber to generate a second mixture, the second mixture comprising one or more second species; and
exposing the workpiece to the second mixture to open a spacer structure disposed on the workpiece,
wherein the second mixture etches one or more portions of the spacer structure and forms a polymer layer on one or more lateral sidewalls of the spacer structure,
wherein etching the one or more portions of the spacer structure comprises removing a top portion of the spacer structure to expose a mandrel structure formed on a substrate layer of the workpiece and removing a bottom portion of the spacer structure to expose the substrate layer, wherein the polymer layer passivates the one or more lateral sidewalls while the one or more portions of the spacer structure are etched.

17. The apparatus of claim 16, wherein operations comprise providing a DC bias to the bias electrode.

* * * * *